(12) United States Patent
Suzuki et al.

(10) Patent No.: US 10,079,282 B2
(45) Date of Patent: Sep. 18, 2018

(54) SEMICONDUCTOR DEVICE AND METHOD OF MANUFACTURING THE SAME

(71) Applicant: Kabushiki Kaisha Toshiba, Minato-ku (JP)

(72) Inventors: Mariko Suzuki, Yokohama (JP); Tadashi Sakai, Yokohama (JP); Chiharu Ota, Kawasaki (JP); Kazuto Takao, Tsukuba (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 244 days.

(21) Appl. No.: 14/473,158

(22) Filed: Aug. 29, 2014

(65) Prior Publication Data

US 2015/0060885 A1    Mar. 5, 2015

(30) Foreign Application Priority Data

Sep. 3, 2013   (JP) ................................ 2013-182560

(51) Int. Cl.
*H01L 29/00*   (2006.01)
*H01L 21/00*   (2006.01)
(Continued)

(52) U.S. Cl.
CPC ...... *H01L 29/1602* (2013.01); *H01L 21/0262* (2013.01); *H01L 21/02376* (2013.01);
(Continued)

(58) Field of Classification Search
CPC ............... H01L 29/1602; H01L 29/868; H01L 29/6603; H01L 29/66037; H01L 29/6609;
(Continued)

(56) References Cited

U.S. PATENT DOCUMENTS 3,982,267 A * 9/1976 Henry .................. H01L 29/868
                                                257/617
5,132,749 A * 7/1992 Nishibayashi ...... H01L 29/1602
                                                257/471
(Continued)

FOREIGN PATENT DOCUMENTS

JP          3-278474       12/1991
JP        2006-303469      11/2006
(Continued)

OTHER PUBLICATIONS

Hiromitsu Kato et al., "N-type Diamond Growth by Phosphorus Doping on (00 1)-oriented Surface", J. Phys. D: Apply. Phys., 40, 2007, pp. 6189-6200.
(Continued)

*Primary Examiner* — Dale E Page
*Assistant Examiner* — Quovaunda V Jefferson
(74) *Attorney, Agent, or Firm* — Oblon, McClelland, Maier & Neustadt, L.L.P.

(57) ABSTRACT

A semiconductor device according to an embodiment includes an i-type or a p-type first diamond semiconductor layer, an n-type second diamond semiconductor layer provided on the first diamond semiconductor layer, a mesa structure and an n-type first diamond semiconductor region provided on the side surface. The mesa structure includes the first diamond semiconductor layer, the second diamond semiconductor layer, a top surface with a plane orientation of ±10 degrees or less from a {100} plane, and a side surface inclined by 20 to 90 degrees with respect to a direction of <011>±20 degrees from the {100} plane. The first diamond semiconductor region is in contact with the second diamond semiconductor layer and has an n-type impurity concentration lower than an n-type impurity concentration of the second diamond semiconductor layer.

12 Claims, 21 Drawing Sheets

(51) Int. Cl.
  *H01L 29/16* (2006.01)
  *H01L 29/868* (2006.01)
  *H01L 21/02* (2006.01)
  *H01L 21/04* (2006.01)
  *H01L 29/66* (2006.01)
  *H01L 29/732* (2006.01)
  *H01L 29/861* (2006.01)
  *H01L 29/04* (2006.01)
  *H01L 29/06* (2006.01)

(52) U.S. Cl.
  CPC .. *H01L 21/02433* (2013.01); *H01L 21/02527* (2013.01); *H01L 21/02576* (2013.01); *H01L 21/02579* (2013.01); *H01L 21/041* (2013.01); *H01L 21/042* (2013.01); *H01L 29/045* (2013.01); *H01L 29/0615* (2013.01); *H01L 29/0619* (2013.01); *H01L 29/6603* (2013.01); *H01L 29/66037* (2013.01); *H01L 29/7325* (2013.01); *H01L 29/861* (2013.01); *H01L 29/868* (2013.01)

(58) Field of Classification Search
  CPC . H01L 29/7325; H01L 29/861; H01L 29/045; H01L 29/0615; H01L 29/0619; H01L 21/02527; H01L 21/02376; H01L 21/02576; H01L 21/02433; H01L 21/02579; H01L 21/0262; H01L 21/041; H01L 21/042; H01L 31/111
  See application file for complete search history.

(56) References Cited

U.S. PATENT DOCUMENTS

| | | | |
|---|---|---|---|
| 8,022,390 B1* | 9/2011 | Kim | H01L 27/1446 250/332 |
| 2006/0214268 A1* | 9/2006 | Maeyama | H01L 29/045 257/628 |
| 2008/0197360 A1* | 8/2008 | Sriram | H01L 29/0657 257/77 |
| 2009/0230516 A1* | 9/2009 | Goodrich | H01L 29/08 257/653 |
| 2012/0034737 A1 | 2/2012 | Kasu et al. | |
| 2012/0228734 A1 | 9/2012 | Kamaga et al. | |
| 2014/0145210 A1 | 5/2014 | Suzuki et al. | |

FOREIGN PATENT DOCUMENTS

| | | |
|---|---|---|
| JP | 2007-165604 | 6/2007 |
| JP | 2010-182961 | 8/2010 |
| JP | 2011-176335 | 9/2011 |
| JP | 2012-59823 | 3/2012 |
| JP | 2012-190981 | 10/2012 |
| JP | 2014-107454 | 6/2014 |
| WO | WO 03/106743 A1 | 12/2003 |

OTHER PUBLICATIONS

U.S. Appl. No. 14/619,565, filed Feb. 11, 2015, Suzuki, et al.
U.S. Appl. No. 14/090,064, filed Nov. 26, 2013, 2014/0145210 A1, Mariko Suzuki et al.

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2013-182560, filed on Sep. 3, 2013, the entire contents of which are incorporated herein by reference.

FIELD

Embodiments described herein relate generally to a semiconductor device and a method of manufacturing the same.

BACKGROUND

Because a diamond has a superior semiconductor characteristic in addition to superior mechanical, chemical, and thermal characteristics, the diamond has attracted attention as a material for a semiconductor device. Particularly, because the diamond has a band gap of about 5.5 eV at room temperature, the diamond has been expected as a material for an ultraviolet emitting device or an electron emitting device using negative electron affinity. In addition, because the diamond has high insulation breakdown resistance, the diamond has been expected as a material for a power device. From high crystallinity, the diamond has been expected as a material for an environmentally resistant device used under a severe environment such as a high temperature or radiation in particular.

The power device manufactured by the diamond has been developed recently. For example, a Schottky barrier diode having a Schottky junction, a device having a PIN structure, and a device in which the Schottky junction is combined with a PN junction have been reported.

In order to realize practical use of the power device manufactured by the diamond, a device structure that enables a high dielectric breakdown voltage of the diamond to be sufficiently used has been expected.

DETAILED DESCRIPTION

A semiconductor device according to an embodiment includes an i-type or a p-type first diamond semiconductor layer; an n-type second diamond semiconductor layer provided on the first diamond semiconductor layer; a mesa structure including the first diamond semiconductor layer, the second diamond semiconductor layer, a top surface with a plane orientation of ±10 degrees or less from a {100} plane, and a side surface inclined by 20 to 90 degrees with respect to a direction of <011>±20 degrees from the {100} plane; and an n-type first diamond semiconductor region provided on the side surface, the first diamond semiconductor region being in contact with the second diamond semiconductor layer and having an n-type impurity concentration lower than an n-type impurity concentration of the second diamond semiconductor layer.

Hereinafter, embodiments described herein will be described with reference to the drawings.

In the present specification, an i-type semiconductor means an intrinsic semiconductor. In other words, the i-type semiconductor means a semiconductor in which an n-type or a p-type dopant is not introduced intentionally. Here, it is assumed that a dopant introduced inevitably according to manufacturing of a semiconductor may be included.

In the following description, the notation of $n^+$, $n$, $n^-$ and $p^+$, $p$, and $p^-$ shows the relative difference of the impurity concentration in each conductive type. That is, an n-type impurity concentration of $n^+$ is relatively higher than that of $n$, and an n-type impurity concentration of $n^-$ is relatively lower than that of $n$. In addition, a p-type impurity concentration of p+ is relatively higher than that of p, and an p-type impurity concentration of p− is relatively lower than that of p. In addition, an n+ type and an n−-type may be simply referred to as an n type, and a p+ type and a p−-type may be simply referred to as a p type.

First Embodiment

A semiconductor device according to this embodiment includes an i-type or a p-type first diamond semiconductor layer; an n-type second diamond semiconductor layer provided on the first diamond semiconductor layer; a mesa structure including the first diamond semiconductor layer, the second diamond semiconductor layer, a top surface with a plane orientation of ±10 degrees or less from a {100} plane, and a side surface inclined by 20 to 90 degrees with respect to a direction of <011>±20 degrees from the {100} plane; and an n-type first diamond semiconductor region provided on the side surface, the first diamond semiconductor region being in contact with the second diamond semiconductor layer and having an n-type impurity concentration lower than an n-type impurity concentration of the second diamond semiconductor layer.

Figure 1:
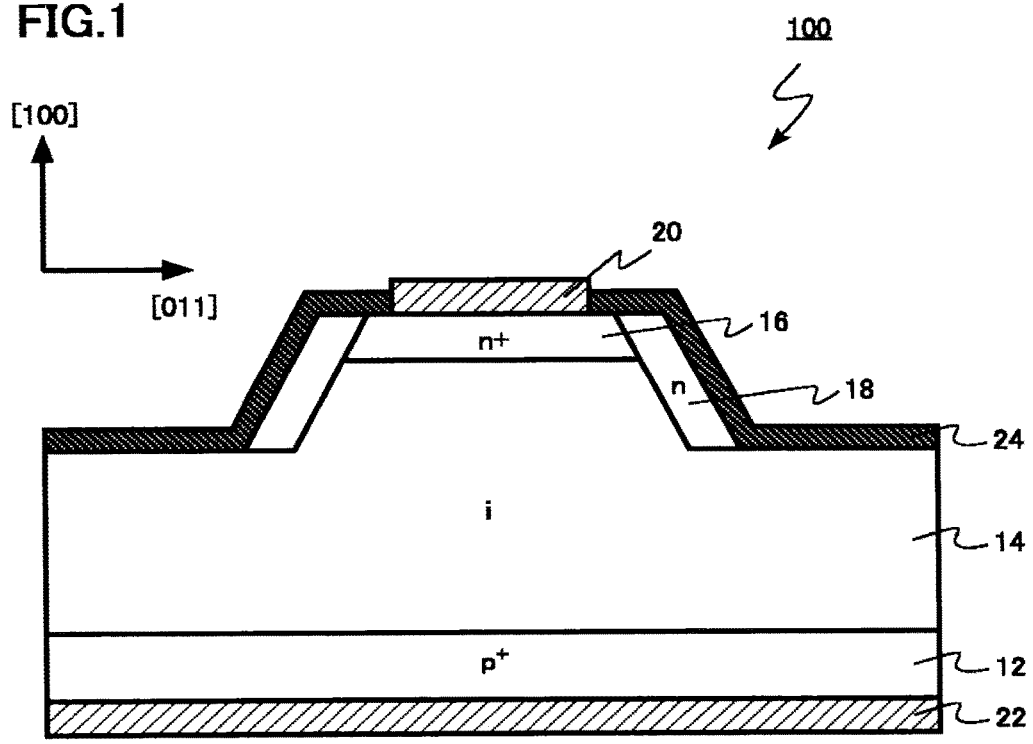
FIG. 1 is a schematic cross-sectional view of a semiconductor device according to a first embodiment.
Figure 2:
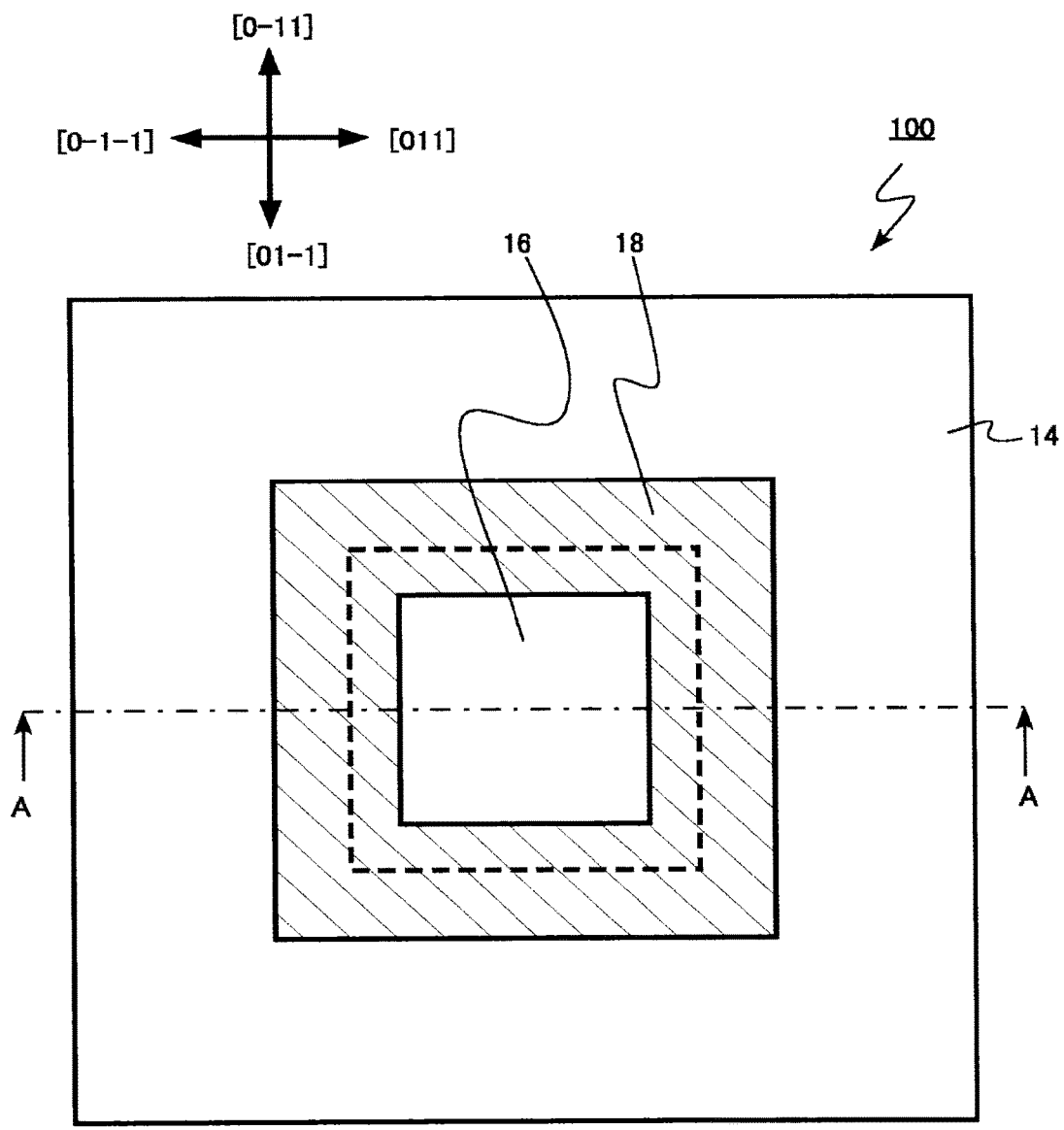
FIG. 2 is a schematic top view of the semiconductor device according to the first embodiment.

FIG. 1 is a schematic cross-sectional view of the semiconductor device according to this embodiment. FIG. 2 is a schematic top view of the semiconductor device according to this embodiment. FIG. 2 illustrates a state in which an electrode and an insulating film are removed from FIG. 1. FIG. 1 is a cross-sectional view taken along the line A-A of FIG. 2. A semiconductor device 100 according to this embodiment is a PIN diode.

The semiconductor device 100 includes a p+-type diamond semiconductor layer (third diamond semiconductor layer) 12, an i-type or a p-type diamond semiconductor layer (first diamond semiconductor layer) 14 provided on the p+-type diamond semiconductor layer 12, and an n+-type diamond semiconductor layer (second diamond semiconductor layer) 16 provided on the i-type or the p-type diamond semiconductor layer 14.

The semiconductor device 100 further includes a trapezoidal mesa structure which includes the i-type or the p-type diamond semiconductor layer (first diamond semiconductor layer) 14 and the n+-type diamond semiconductor layer (second diamond semiconductor layer) 16. The semiconductor device 100 further includes an n-type diamond semiconductor region (first diamond semiconductor region) 18 provided on the side surface of the mesa structure and is in contact with the n+-type diamond semiconductor layer (second diamond semiconductor layer) 16.

On a top surface of the n+-type diamond semiconductor layer (second diamond semiconductor layer) 16, a cathode electrode (first electrode: negative electrode) 20 is provided. In addition, on a bottom surface of the p+-type diamond semiconductor layer (third diamond semiconductor layer) 12, an anode electrode (second electrode: positive electrode) 22 is provided.

The p+-type diamond semiconductor layer (third diamond semiconductor layer) 12 is a so-called p-type contact layer to form the anode electrode (second electrode) 22. For example, the p+-type diamond semiconductor layer (third diamond semiconductor layer) 12 includes boron (B) as p-type impurities. In addition, the p+-type diamond semiconductor layer (third diamond semiconductor layer) 12 has a p-type impurity concentration higher than a p-type impurity of the first diamond semiconductor layer 14.

The i-type or the p-type diamond semiconductor layer (first diamond semiconductor layer) 14 is a so-called drift layer to transport carriers. The i-type or the p-type diamond semiconductor layer (first diamond semiconductor layer) 14 is formed of an intrinsic semiconductor or a p-type semiconductor.

The n+-type diamond semiconductor layer (second diamond semiconductor layer) 16 is a so-called n-type contact layer to form the cathode electrode (first electrode) 20. For example, the n+-type diamond semiconductor layer (second diamond semiconductor layer) 16 includes phosphorus (P) as n-type impurities.

The top surface of the mesa structure has the plane orientation of ±10 degrees or less from the {100} plane. In addition, each of the four side surfaces of the mesa structure is inclined by 20 to 90 degrees with respect to the direction of <011>±20 degrees from the {100} plane.

In FIG. 2, a hatched portion by oblique lines shows the n-type diamond semiconductor region (first diamond semiconductor region) 18 provided on the side surface of the mesa structure. A rectangle by dotted lines shows a boundary of the top surface and the oblique surface of the mesa structure. As illustrated in FIGS. 1 and 2, the four side surfaces are inclined with respect to [011], [0-11], [01-1], and [0-1-1] directions from the {100} surface, respectively.

The n-type diamond semiconductor region (first diamond semiconductor region) 18 is a so-called electric field relaxation layer to improve a breakdown voltage when the PIN diode is reversely biased. The n-type diamond semiconductor region (first diamond semiconductor region) 18 includes phosphorus (P) as n-type impurities.

The n-type diamond semiconductor region 18 provided around the n+-type diamond semiconductor layer 16 is in contact with the n+-type diamond semiconductor layer 16. An n-type impurity concentration of the n-type diamond semiconductor region 18 is lower than an n-type impurity concentration of the n+-type diamond semiconductor layer 16.

The cathode electrode (first electrode: negative electrode) 20 is formed of a metal. The metal is, for example, titanium (Ti). A contact between the cathode electrode 20 and the n+-type diamond semiconductor layer 16 is preferably an ohmic contact.

The anode electrode (second electrode: positive electrode) 22 is formed of a metal. The metal is, for example, titanium (Ti). A contact between the anode electrode 22 and the p+-type diamond semiconductor layer 12 is preferably an ohmic contact.

A surface of the PIN diode 100 other than the cathode electrode (first electrode: negative electrode) 20 is covered with a protection insulating film 24. The protection insulating film 24 is, for example, a silicon nitride film.

According to the PIN diode 100 of this embodiment, the mesa structure is provided. As a result, an electric field is reduced and a breakdown voltage of a junction is improved. The inclination of the oblique surface of the mesa structure is preferably 45 to 65 degrees from the top surface of the mesa structure, from the viewpoint of relaxing the electric field.

In this embodiment, the n-type diamond semiconductor region 18, the electric field relaxation layer, is provided, so that the breakdown voltage of the junction is improved. Particularly, as illustrated in FIG. 1, the n-type diamond semiconductor region (first diamond semiconductor region) 18 is preferably provided on a corner portion of the top surface of the mesa structure and the side surface of the mesa structure. The corner portion is used as a region where the n-type impurity concentration is low, so that an extension of a depletion layer at the n-type semiconductor layer of the corner portion increases. Therefore, further electric field relaxation effect is obtained and the breakdown voltage of the junction is improved.

In the diamond semiconductor, it is difficult to perform impurity doping by ion implantation or solid-phase diffusion, and a method of performing doping when a semiconductor layer is formed is usually adopted. In addition, plane orientation dependency of impurity taking efficiency is notable when a film of the diamond semiconductor is formed.

In the diamond semiconductor formed by chemical vapor deposition (CVD) growth, taking efficiency of impurities in a layer strongly depends on the plane orientation. For example, when the n-type dopant impurities are phosphorus (P), taking efficiency of phosphorous is about 0.02% in the case of {111} plane growth on a {111} plane substrate, that is, in the case of growth in a <111> direction.

Meanwhile, taking efficiency of phosphorous is about 0.0002% in the case of {110} plane growth on a {110} plane substrate, that is, the case of growth in a <110> direction. In addition, taking efficiency of phosphorous is 0.00001% or less in the case of {100} plane growth on a {100} plane substrate, that is, the case of growth in a <100> direction.

In this embodiment, the oblique surface of the mesa structure is provided in a specific direction, which makes it possible to easily cause the impurity concentration of the n-type diamond semiconductor region (first diamond semiconductor region) 18 to be a desired concentration. Therefore, the concentration of the n-type diamond semiconductor region 18, which is to be the electric field relaxation layer, is stabilized, and PIN diode in which a dielectric breakdown voltage is high can be realized.

That is, the growth of the n-type diamond semiconductor region 18 is approximated to the growth in the <111> direction, so that taking efficiency of phosphorous is increased and controllability of the n-type impurity concentration is improved. The mesa structure side surface preferably has a plane orientation inclined by 45 to 65 degrees with respect to the direction of <011>±20 degrees from the {100} plane, from the viewpoint of approximating the growth of the n-type diamond semiconductor region 18 to the growth in the <111> direction.

In this embodiment, the impurity concentration of the p$^+$-type diamond semiconductor layer 12 is preferably between 5×10$^{19}$ atoms/cm$^3$ and 1×10$^{21}$ atoms/cm$^3$ inclusive. When the impurity concentration is less than the impurity concentration in the above range, contact resistance between the anode electrode 22 and the p$^+$-type diamond semiconductor layer 12 may excessively increase. In addition, when the impurity concentration is more than the impurity concentration in the above range, it may become difficult to form the semiconductor layer.

The i-type or the p-type diamond semiconductor layer 14 is preferably an intrinsic semiconductor (i-type), from the viewpoint of realizing a high breakdown voltage and high mobility. When the i-type or the p-type diamond semiconductor layer 14 is of the i-type, the impurity concentration is preferably 1×10$^{15}$ atoms/cm$^3$ or less, from the viewpoint of realizing the high breakdown voltage and the high mobility.

Meanwhile, when the i-type or the p-type diamond semiconductor layer 14 is of the p-type, the p-type impurity concentration of the p-type diamond semiconductor layer is preferably 1×10$^{16}$ atoms/cm$^3$ or less, from the viewpoint of realizing the high breakdown voltage.

For example, the impurity concentration of the n$^+$-type diamond semiconductor layer 16 is preferably between 5×10$^{19}$ atoms/cm$^3$ and 1×10$^{21}$ atoms/cm$^3$ inclusive. When the impurity concentration is less than the impurity concentration in the above range, contact resistance between the cathode electrode 20 and the n$^+$-type diamond semiconductor layer 16 may excessively increase. In addition, when the impurity concentration is more than the impurity concentration in the above range, it may become difficult to form the semiconductor layer.

For example, the impurity concentration of the n-type diamond semiconductor region (first diamond semiconductor region) 18 is preferably between 1×10$^{15}$ atoms/cm$^3$ and 5×10$^{18}$ atoms/cm$^3$ inclusive, and is more preferably between 1×10$^{16}$ atoms/cm$^3$ and 1×10$^{18}$ atoms/cm$^3$ inclusive. When the impurity concentration is out of the above range, a sufficient breakdown voltage improvement effect may not be obtained.

Next, a method of manufacturing the semiconductor device according to this embodiment will be described.

The method of manufacturing the semiconductor device according to this embodiment includes forming an i-type or a p-type first diamond semiconductor layer by an epitaxial growth method; forming an n-type second diamond semiconductor layer on the first diamond semiconductor layer by the epitaxial growth method; forming a mesa structure by etching, the mesa structure including the first diamond semiconductor layer, the second diamond semiconductor layer, a top surface with a plane orientation of ±10 degrees or less from a {100} plane, and a side surface inclined by 20 to 90 degrees with respect to a direction of <011>±20 degrees from the {100} plane; and forming an n-type first diamond semiconductor region on the side surface by the epitaxial growth method, the first diamond semiconductor region being in contact with the second diamond semiconductor layer and having an n-type impurity concentration lower than an n-type impurity concentration of the second diamond semiconductor layer.

First, the method of manufacturing the semiconductor device according to a first example of this embodiment will be described. FIGS. 3 to 6 are schematic cross-sectional views illustrating the method of manufacturing the semiconductor device according to the first example of this embodiment.

First, a single crystal diamond substrate (third diamond semiconductor layer) 12 whose surface has the plane orientation of the {100} plane is prepared. For example, the substrate 12 is of the p$^+$ type.

Figure 3:
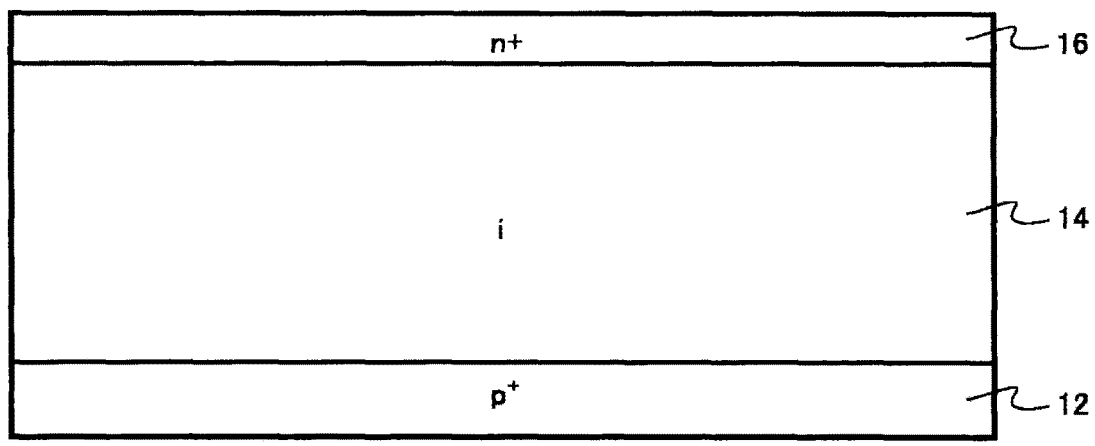
FIG. 3 is a schematic cross-sectional view illustrating a method of manufacturing the semiconductor device according to a first example of the first embodiment.

In addition, the i-type or the p-type diamond semiconductor layer (first diamond semiconductor layer) 14 and the n$^+$-type diamond semiconductor layer (second diamond semiconductor layer) 16 are formed on the substrate (third diamond semiconductor layer) 12 by the epitaxial growth method (refer to FIG. 3). For example, the i-type or the p-type diamond semiconductor layer (first diamond semiconductor layer) 14 and the n$^+$-type diamond semiconductor layer (second diamond semiconductor layer) 16 are formed using a microwave plasma chemical vapor deposition (CVD) method.

Figure 4:
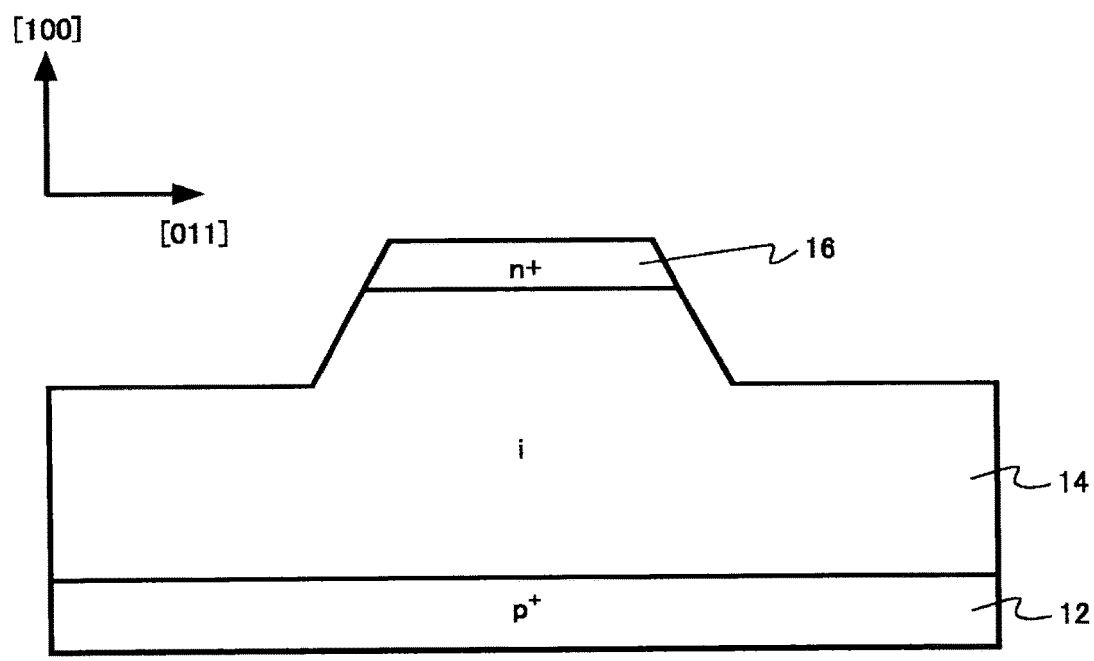
FIG. 4 is a schematic cross-sectional view illustrating the method of manufacturing the semiconductor device according to the first example of the first embodiment.

Then, the mesa structure is formed by the etching (refer to FIG. 4). The mesa structure is formed to include the i-type or the p-type diamond semiconductor layer 14 and the n$^+$-type diamond semiconductor layer 16. In addition, the mesa structure has the top surface with the plane orientation of ±10 degrees or less from the {100} plane and the side surface with the plane orientation inclined by 20 to 90 degrees with respect to the direction of <011>±20 degrees from the {100} plane.

For example, the mesa structure is formed using a lithography method and a reactive ion etching (RIE) method.

When the RIE is performed, taper etching is performed such that the side surface of the mesa structure has the inclination of less than 90 degrees with respect to the {100} plane.

Figure 5:
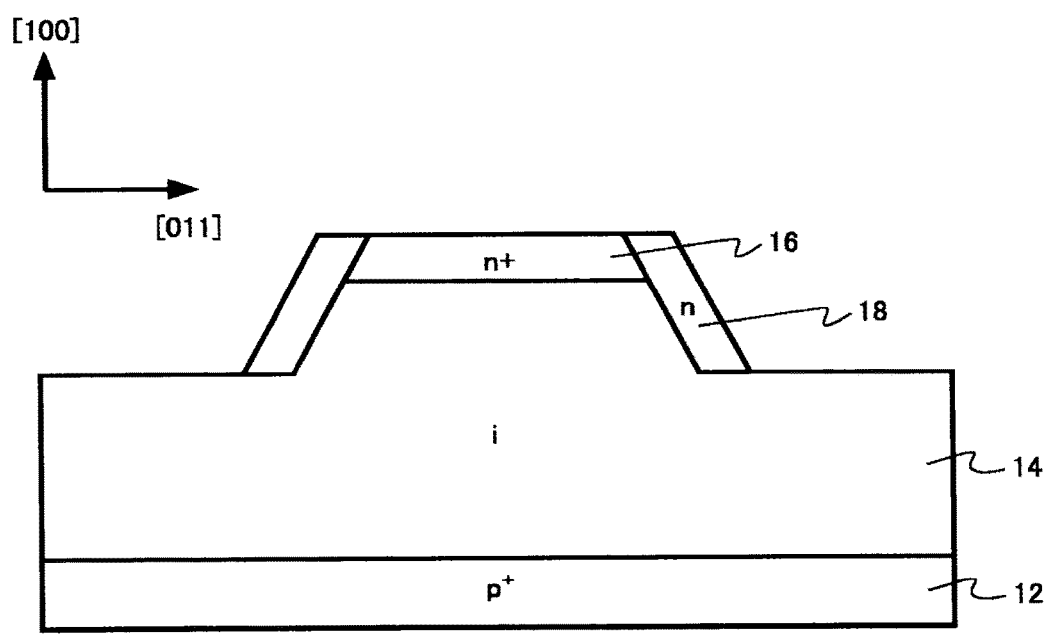
FIG. 5 is a schematic cross-sectional view illustrating the method of manufacturing the semiconductor device according to the first example of the first embodiment.
Figure 6:
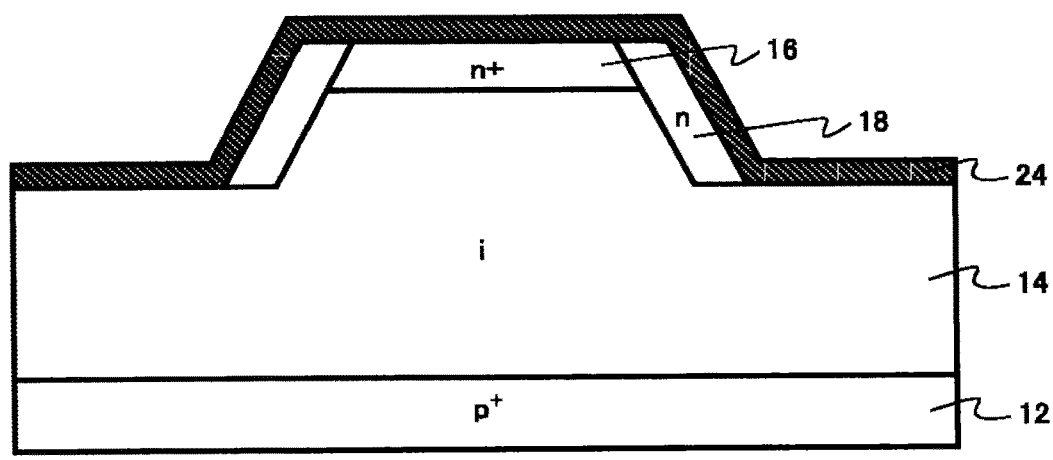
FIG. 6 is a schematic cross-sectional view illustrating the method of manufacturing the semiconductor device according to the first example of the first embodiment.

Next, the n-type diamond semiconductor region (first diamond semiconductor region) 18, which is in contact with the n+-type diamond semiconductor layer (second diamond semiconductor layer) 16 and has the n-type impurity concentration lower than that of the n+-type diamond semiconductor layer 16, is formed on the side surface of the mesa structure by the epitaxial growth method (refer to FIG. 5). For example, the n-type diamond semiconductor region (first diamond semiconductor region) 18 is formed using the microwave plasma chemical vapor deposition (CVD) method.

The n-type diamond semiconductor region (first diamond semiconductor region) 18 is grown in the <111> direction by adjusting an α parameter (ratio of methane and hydrogen). Thus, taking efficiency of n-type impurities, for example, phosphorus (P) is improved and controllability of the impurity concentration is improved.

In addition, because the plane orientation of the surface of the i-type or the p-type diamond semiconductor layer 14 is close to the {100} plane, the epitaxial growth of the n-type semiconductor is suppressed. Therefore, the n-type diamond semiconductor region (first diamond semiconductor region) 18 is rarely formed on the surface of the p-type diamond semiconductor layer 14.

Next, the protection insulating film 24 is formed on the i-type or the p-type diamond semiconductor layer (first diamond semiconductor layer) 14 and the n+-type diamond semiconductor layer (second diamond semiconductor layer) 16. The protection insulating film 24 is, for example, a silicon nitride film formed using the CVD method.

Then, a part of the protection insulating film 24 on the top surface of the mesa structure is removed using the lithography method and the RIE method. In addition, the cathode electrode (first electrode: negative electrode) 20 is formed by depositing a metal film. For example, when the metal film is deposited, titanium (Ti)/platinum (Pt)/gold (Au) is deposited by electron beam evaporation. Then, for example, heat treatment is performed.

In addition, the anode electrode (second electrode) 22 is formed on the back surface of the substrate (third diamond semiconductor layer) 12 by depositing a metal film. For example, when the metal film is deposited, titanium (Ti)/platinum (Pt)/gold (Au) is deposited by electron beam evaporation. Then, for example, heat treatment is performed.

By the method of manufacturing the semiconductor device according to the first example described above, the semiconductor device 100 illustrated in FIG. 1 is formed.

Figure 7:
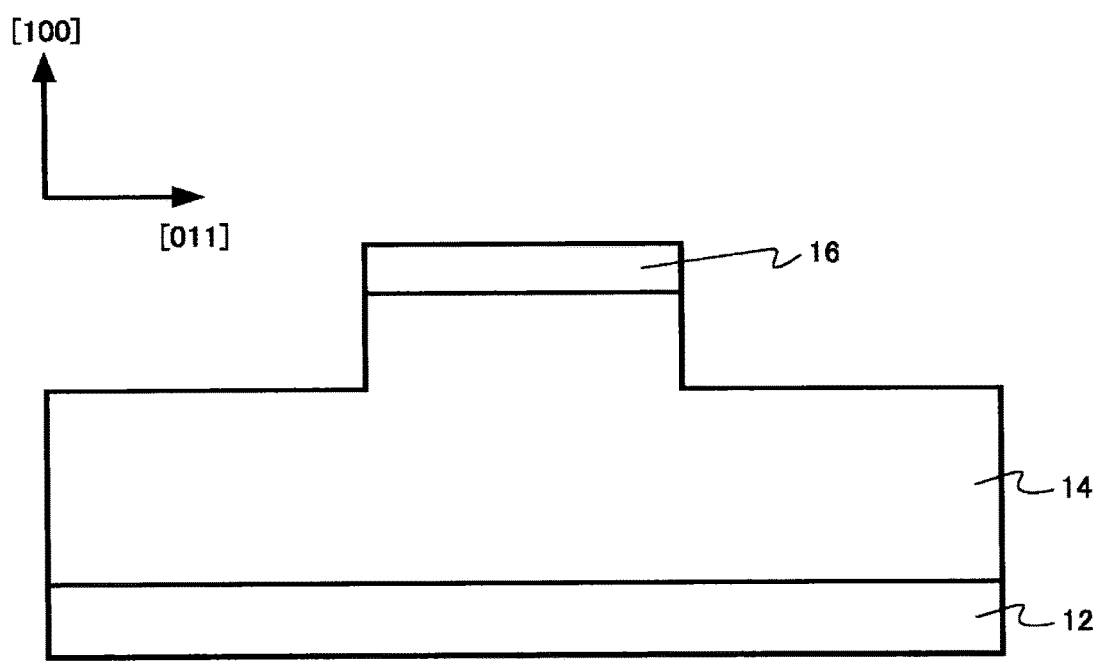
FIG. 7 is a schematic cross-sectional view illustrating the method of manufacturing the semiconductor device according to a second example of the first embodiment.
Figure 8:
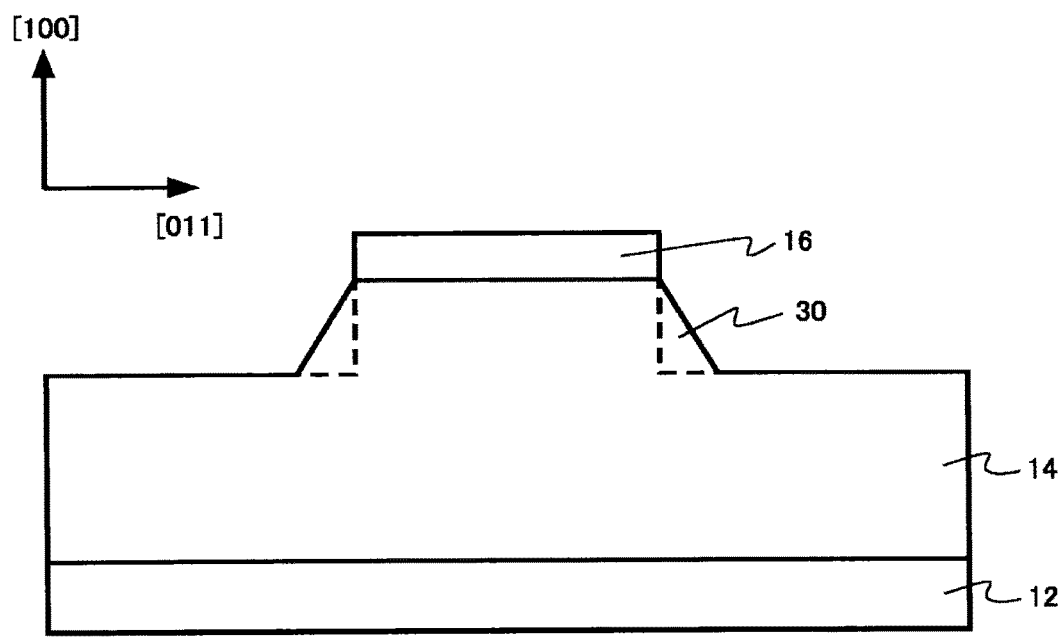
FIG. 8 is a schematic cross-sectional view illustrating the method of manufacturing the semiconductor device according to the second example of the first embodiment.
Figure 9:
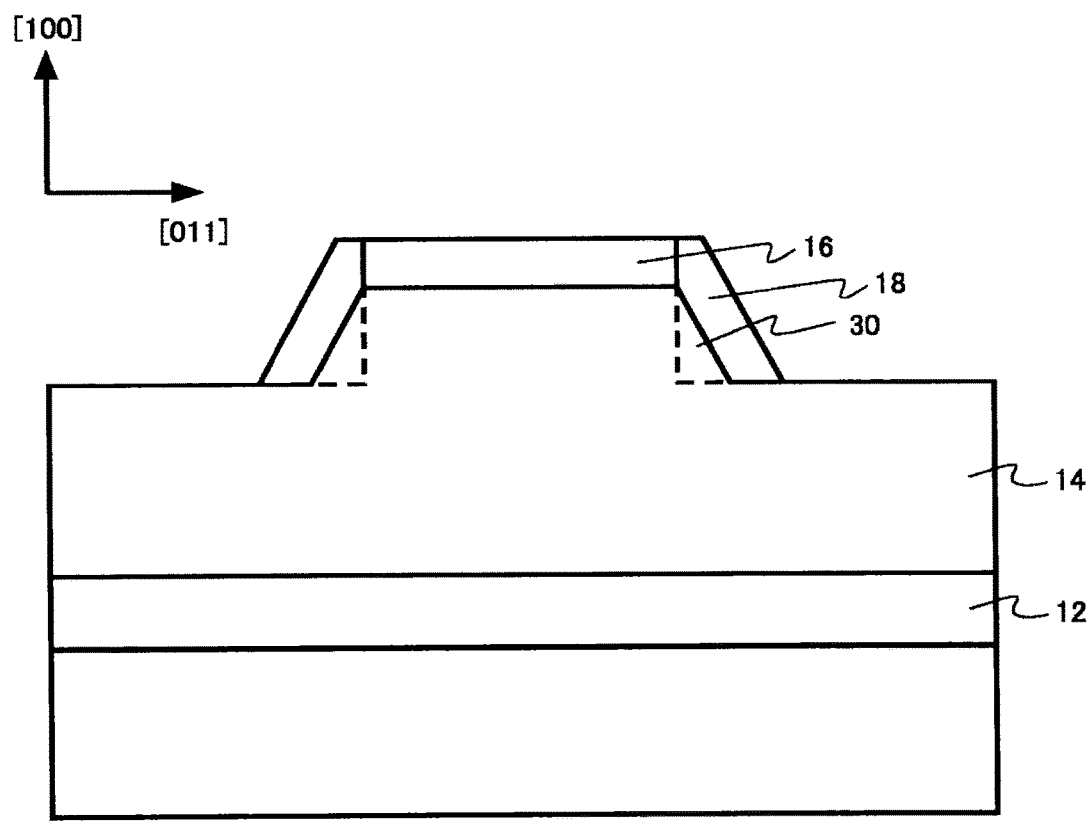
FIG. 9 is a schematic cross-sectional view illustrating the method of manufacturing the semiconductor device according to the second example of the first embodiment.

Next, the method of manufacturing the semiconductor device according to a second example of this embodiment will be described. FIGS. 7 to 9 are schematic cross-sectional views illustrating the method of manufacturing the semiconductor device according to the second example of this embodiment.

In the second example, different from the first example, the p-type or the i-type third diamond semiconductor region is formed on the side surface by the epitaxial growth method after the mesa structure is formed and before the first diamond semiconductor region is formed.

First, similar to the first example, the single crystal diamond substrate (third diamond semiconductor layer) 12 of which the surface has the plane orientation of the {100} plane is prepared. For example, the substrate 12 is of the p+ type.

In addition, the i-type or the p-type diamond semiconductor layer (first diamond semiconductor layer) 14 and the n+-type diamond semiconductor layer (second diamond semiconductor layer) 16 are formed on the substrate (third diamond semiconductor layer) 12 by the epitaxial growth method. For example, the i-type or the p-type diamond semiconductor layer (first diamond semiconductor layer) 14 and the n+-type diamond semiconductor layer (second diamond semiconductor layer) 16 are formed using the microwave plasma chemical vapor deposition (CVD) method.

Next, the mesa structure is formed by the etching (refer to FIG. 7). The mesa structure is formed to include the i-type or the p-type diamond semiconductor layer 14 and the n+-type diamond semiconductor layer 16. The mesa structure has the top surface with the plane orientation of ±10 degrees or less from the {100} plane and the side surface with the plane orientation inclined substantially vertically with respect to the direction of <011>±20 degrees from the {100} plane. Here, substantially vertical inclination means the inclination of 80 to 90 degrees. In the second example, the etching is performed such that the side surface of the mesa structure becomes substantially vertical to the {100} plane, when the mesa structure is formed.

Next, after the mesa structure is formed, an i-type or a p-type third diamond semiconductor region 30 is formed on the side surface of the mesa structure by the epitaxial growth method (refer to FIG. 8). For example, a diamond semiconductor of the same conductive type as the diamond semiconductor layer (first diamond semiconductor layer) 14 is formed.

Then, the n-type diamond semiconductor region (first diamond semiconductor region) 18 is formed by the epitaxial growth method (refer to FIG. 9). The n-type diamond semiconductor region (first diamond semiconductor region) 18 is in contact with the n+-type diamond semiconductor layer (second diamond semiconductor layer) 16 and has the n-type impurity concentration lower than that of n+-type diamond semiconductor layer 16. In addition, the n-type diamond semiconductor region (first diamond semiconductor region) 18 has the n-type impurity concentration higher than that of the third diamond semiconductor region 30. For example, the n-type diamond semiconductor region (first diamond semiconductor region) 18 is formed using the microwave plasma chemical vapor deposition (CVD) method. The i-type or the p-type third diamond semiconductor region 30 and the n-type first diamond semiconductor region 18 can be formed continuously by changing dopant gas.

The n-type diamond semiconductor region (first diamond semiconductor region) 18 is grown in the <111> direction. Thus, controllability of the concentration of the n-type impurities, for example, phosphorous (P), is improved.

Because the plane orientation of the surface of the i-type or the p-type diamond semiconductor layer 14 is close to the {100} surface, the epitaxial growth of the n-type semiconductor is suppressed. Therefore, the n-type diamond semiconductor region (first diamond semiconductor region) 18 is rarely formed on the surface of the p-type diamond semiconductor layer 14.

The following processes are the same as those of the first example. The semiconductor device 100 illustrated in FIG. 1 is formed by the method of manufacturing the semiconductor device according to the second example described above.

According to the second example, when the mesa structure is formed, it is not necessary to perform the taper etching on the diamond semiconductor layer with the slight inclination. Therefore, processing and shape control of the mesa structure are facilitated.

As described above, according to this embodiment, the side surface of the mesa structure has the specific plane orientation and the electric field relaxation region is provided on the side surface of the mesa structure. For this reason, controllability of the impurity concentration of the electric field relaxation region is improved. Therefore, a semiconductor device and a method of manufacturing the same that can realize a high dielectric breakdown voltage can be provided.

Second Embodiment

A semiconductor device according to this embodiment is the same as the semiconductor device according to the first embodiment, except that the semiconductor device further includes a plurality of n-type second diamond semiconductor regions provided on a surface of a first diamond semiconductor layer around a mesa structure and have an n-type impurity concentration lower than the n-type impurity concentration of a second diamond semiconductor layer. Therefore, a description of content overlapped to the content of the first embodiment is omitted.

Figure 10:
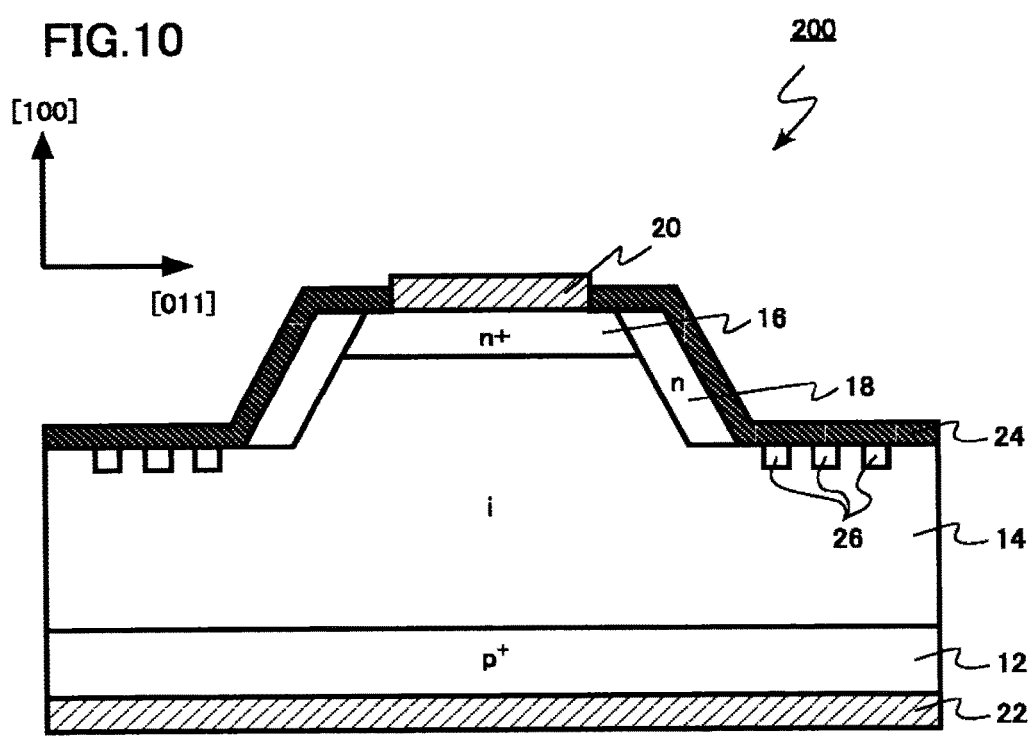
FIG. 10 is a schematic cross-sectional view of a semiconductor device according to a second embodiment.
Figure 11:
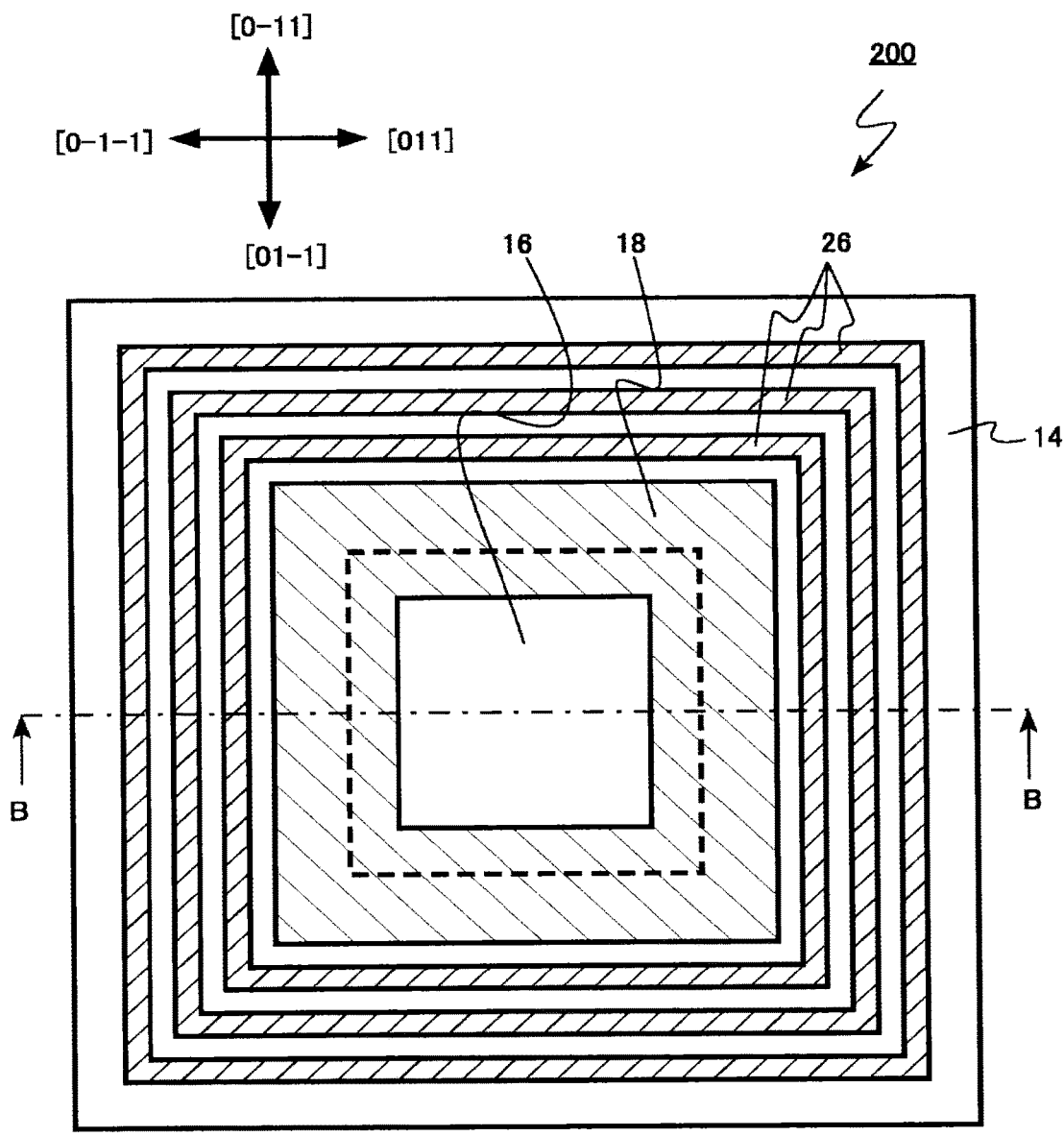
FIG. 11 is a schematic top view of the semiconductor device according to the second embodiment.

FIG. 10 is a schematic cross-sectional view of the semiconductor device according to this embodiment. FIG. 11 is a schematic top view of the semiconductor device according to this embodiment. FIG. 11 illustrates a state in which an electrode and an insulating film are removed from the device in FIG. 10. FIG. 10 is a cross-sectional view taken along the line B-B of FIG. 11. A semiconductor device 200 according to this embodiment is a PIN diode.

The semiconductor device 200 includes a plurality of n-type diamond semiconductor regions (second diamond semiconductor regions) 26. The n-type diamond semiconductor regions (second diamond semiconductor regions) 26 improves a breakdown voltage when the PIN diode is reversely biased. The n-type diamond semiconductor regions 26 are so-called guard rings.

The n-type diamond semiconductor regions 26 are provided on a surface of an i-type or a p-type first diamond semiconductor layer 14 around the mesa structure. For example, the n-type diamond semiconductor regions 26 are annular regions to surround the mesa structure and are provided at the same width and the same interval.

The n-type diamond semiconductor regions (second diamond semiconductor regions) 26 include phosphorus (P) as n-type impurities. An n-type impurity concentration of the n-type diamond semiconductor region 26 is lower than an n-type impurity concentration of an n$^+$-type diamond semiconductor layer 16.

For example, the impurity concentration of the n-type diamond semiconductor regions (second diamond semiconductor regions) 26 is preferably between $1\times10^{15}$ atoms/cm$^3$ and $5\times10^{18}$ atoms/cm$^3$ inclusive, and is more preferably between $1\times10^{16}$ atoms/cm$^3$ and $1\times10^{18}$ atoms/cm$^3$ inclusive. When the impurity concentration is out of the above range, a sufficient breakdown voltage improvement effect may not be obtained.

Figure 12:
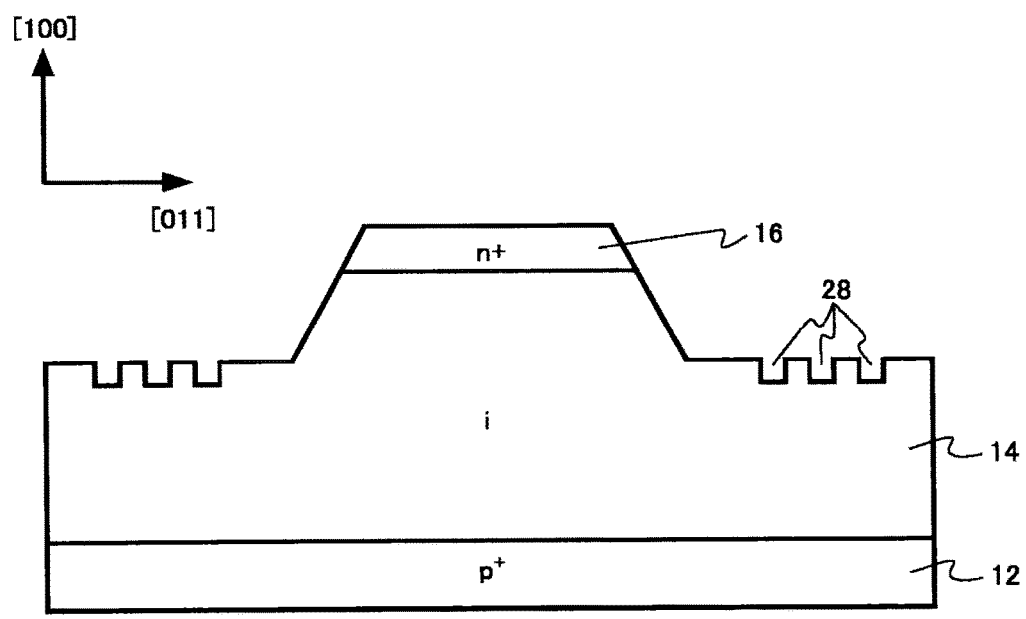
FIG. 12 is a schematic cross-sectional view illustrating a method of manufacturing the semiconductor device according to the second embodiment.
Figure 13:
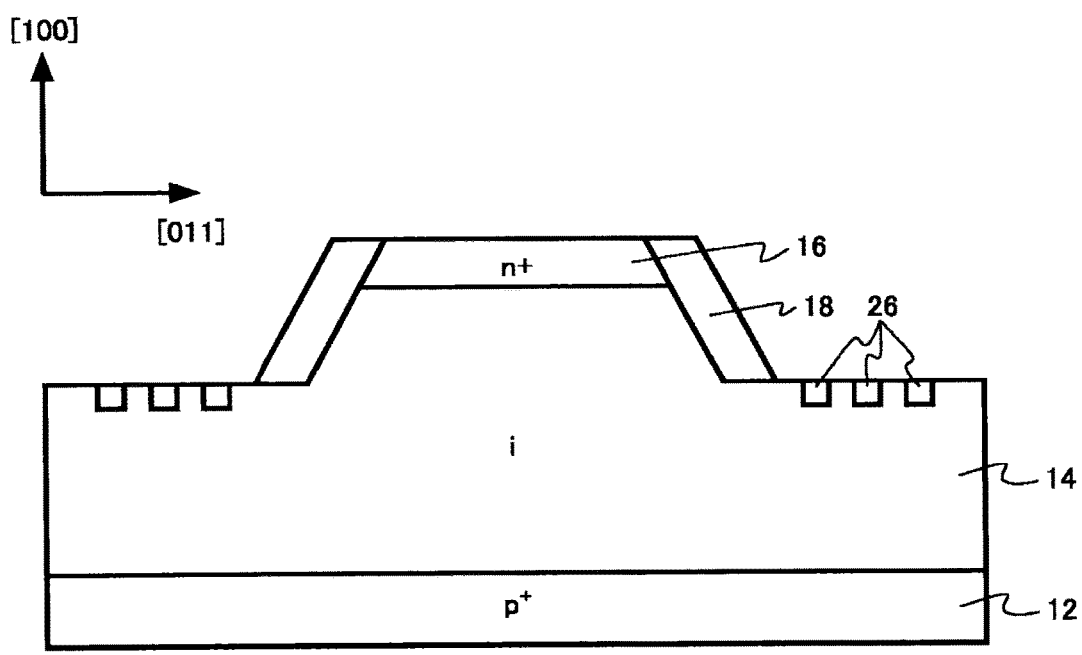
FIG. 13 is a schematic cross-sectional view illustrating the method of manufacturing the semiconductor device according to the second embodiment.

Next, a method of manufacturing the semiconductor device according to this embodiment will be described. FIGS. 12 and 13 are schematic cross-sectional views illustrating the method of manufacturing the semiconductor device according to this embodiment.

The method of manufacturing the semiconductor device according to this embodiment includes forming a plurality of grooves on a surface of a first diamond semiconductor layer around a mesa structure after the mesa structure is formed and before a first diamond semiconductor region is formed, and forming a plurality of n-type second diamond semiconductor regions on the grooves when the first diamond semiconductor region is formed. The plurality of n-type second diamond semiconductor regions has an n-type impurity concentration lower than the n-type impurity concentration of a second diamond semiconductor layer.

Similar to the method according to the first form of the first embodiment, the mesa structure is formed by taper etching. Then, grooves 28 are formed on the surface of the first diamond semiconductor layer 14 around the mesa structure, using a lithography method and an RIE method (refer to FIG. 12).

Next, similar to the method according to the first form of the first embodiment, an n-type diamond semiconductor region (first diamond semiconductor region) 18, which is in contact with an n$^+$-type diamond semiconductor layer (second diamond semiconductor layer) 16 and has an n-type impurity concentration lower than an n-type impurity concentration of the n$^+$-type diamond semiconductor layer 16, is formed on a side surface of the mesa structure by epitaxial growth method. Likewise, the n-type diamond semiconductor regions (second diamond semiconductor regions) 26 are formed in the grooves 28 (refer to FIG. 13). For example, the n-type diamond semiconductor region (first diamond semiconductor region) 18 and the n-type diamond semiconductor regions (second diamond semiconductor regions) 26 are formed using a microwave plasma chemical vapor deposition (CVD) method.

Then, the method of manufacturing the semiconductor device is the same as the method according to the first form of the first embodiment. The semiconductor device 200 illustrated in FIG. 10 is manufactured by the method of manufacturing the semiconductor device described above.

As described above, according to this embodiment, the n-type diamond semiconductor regions (second diamond semiconductor regions) 26 are provided. As a result, a semiconductor device and a method of manufacturing the same that can realize a higher dielectric breakdown voltage can be provided.

Third Embodiment

A semiconductor device according to this embodiment is the same as the semiconductor device according to the second embodiment, except that a first diamond semiconductor region and second diamond semiconductor regions are in contact with each other. Therefore, a description of content overlapped to the content of the first embodiment is omitted.

Figure 14:
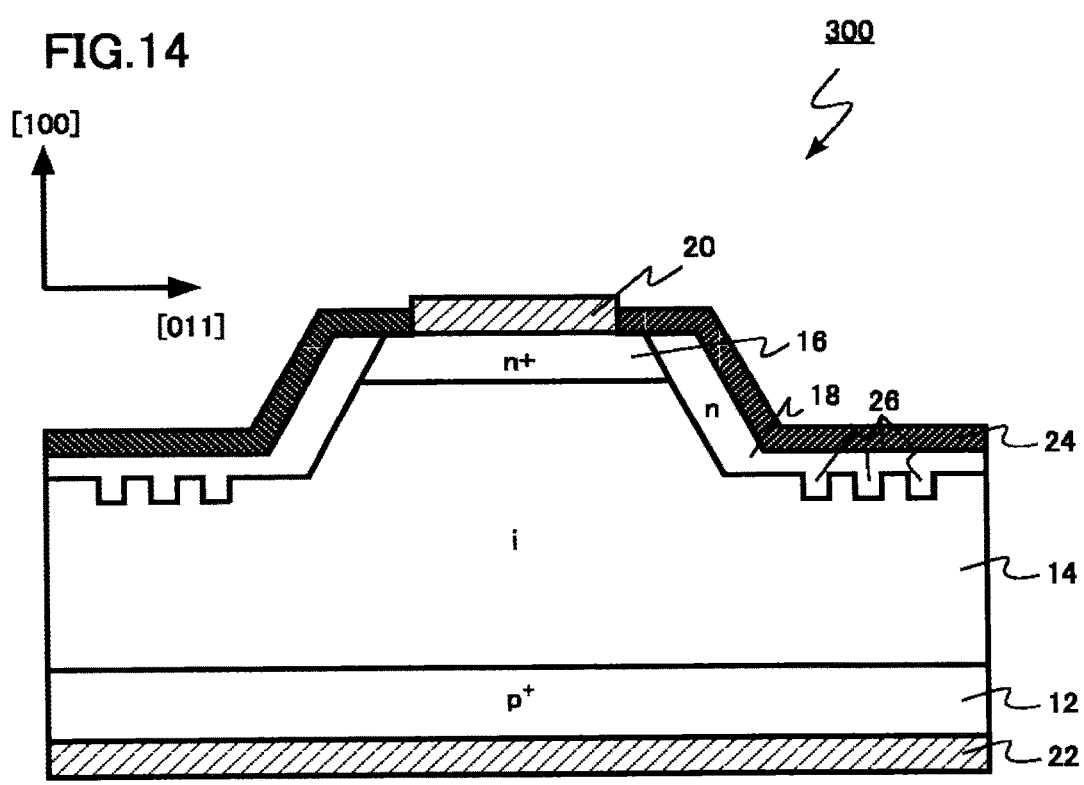
FIG. 14 is a schematic cross-sectional view of a semiconductor device according to a third embodiment.
Figure 15:
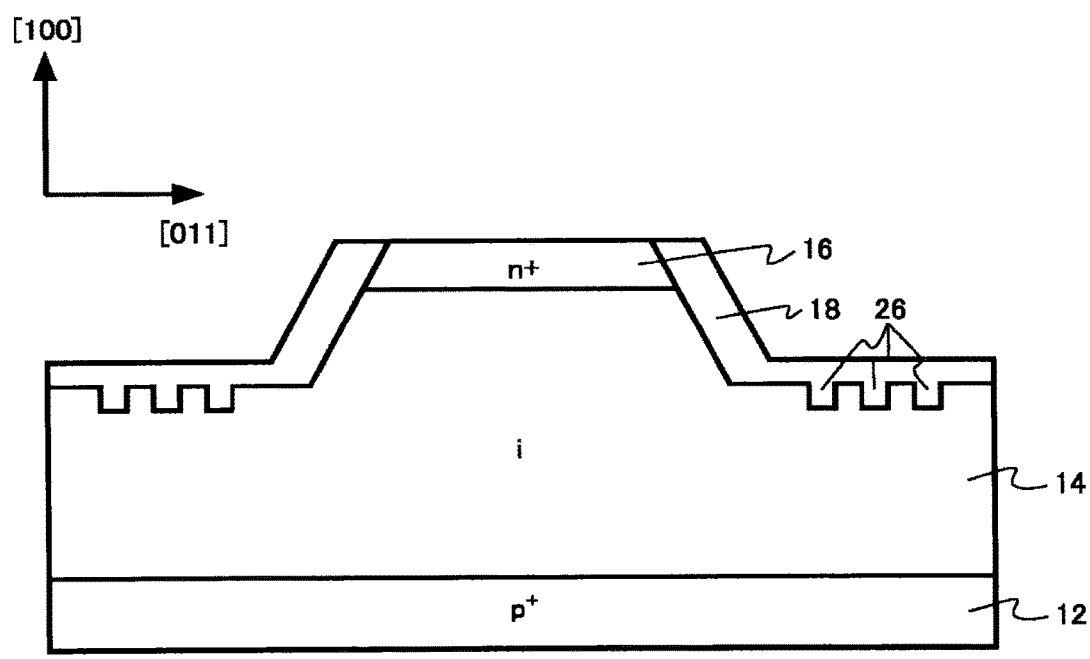
FIG. 15 is a schematic cross-sectional view illustrating a method of manufacturing the semiconductor device according to the third embodiment.

FIG. 14 is a schematic cross-sectional view of the semiconductor device according to this embodiment. A semiconductor device 300 according to this embodiment is a PIN diode.

The semiconductor device 300 includes n-type diamond semiconductor regions (second diamond semiconductor regions) 26. In addition, the n-type diamond semiconductor regions (second diamond semiconductor regions) 26 are in contact with an n-type diamond semiconductor region (first diamond semiconductor region) 18. That is, the n-type diamond semiconductor region (first diamond semiconductor region) 18 is also provided on a surface of an i-type or p-type first diamond semiconductor layer 14 around a mesa structure.

Next, a method of manufacturing the semiconductor device according to this embodiment will be described. FIG.

15 is a schematic cross-sectional view illustrating the method of manufacturing the semiconductor device according to this embodiment. In the method of manufacturing the semiconductor device according to this embodiment, the first diamond semiconductor region and the second diamond semiconductor regions are formed to be in contact with each other.

The method according to the third embodiment is the same as the method according to the second embodiment, until grooves 28 are formed on the surface of the first diamond semiconductor layer 14 around the mesa structure. Then, the n-type diamond semiconductor region (first diamond semiconductor region) 18 and the n-type diamond semiconductor regions (second diamond semiconductor regions) 26 are formed by the epitaxial growth method.

At this time, for example, the n-type diamond semiconductor region (first diamond semiconductor region) 18 is also grown on the surface of the i-type or the p-type first diamond semiconductor layer 14 around the mesa structure by adjusting an α parameter (ratio of methane and hydrogen) when a film is formed using a CVD method.

As described above, according to this embodiment, the n-type diamond semiconductor regions (second diamond semiconductor regions) 26 are provided. As a result, a semiconductor device and a method of manufacturing the same that can realize a high dielectric breakdown voltage can be provided.

Fourth Embodiment

A semiconductor device according to this embodiment is different from the semiconductor device according to the first embodiment in that the semiconductor device further includes a p-type third diamond semiconductor layer provided on a second diamond semiconductor layer and a third electrode electrically connected to the third diamond semiconductor layer. A description of content overlapped to the content of the first embodiment is omitted.

Figure 16:
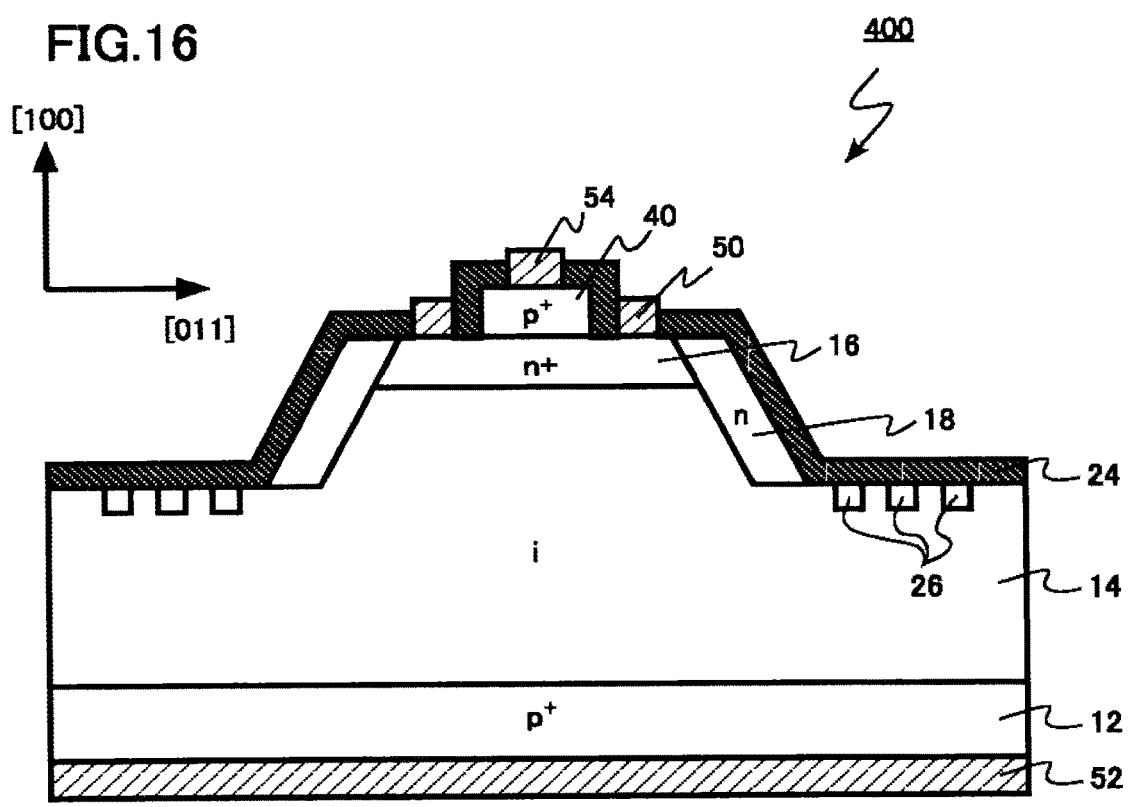
FIG. 16 is a schematic cross-sectional view of a semiconductor device according to a fourth embodiment.

FIG. 16 is a schematic cross-sectional view of the semiconductor device according to this embodiment. A semiconductor device 400 according to this embodiment is a PNP bipolar transistor.

The semiconductor device 400 includes a p$^+$-type diamond semiconductor layer (third diamond semiconductor layer) 12, an i-type or a p-type diamond semiconductor layer (first diamond semiconductor layer) 14 provided on the p$^+$-type diamond semiconductor layer 12, and an n$^+$-type diamond semiconductor layer (second diamond semiconductor layer) 16 provided on the i-type or the p-type diamond semiconductor layer 14. The semiconductor device 400 further includes a p$^+$-type diamond semiconductor layer (fourth diamond semiconductor layer) 40 provided on the n$^+$-type diamond semiconductor layer (second diamond semiconductor layer) 16.

The semiconductor device 400 further includes a trapezoidal mesa structure which includes the i-type or the p-type diamond semiconductor layer (first diamond semiconductor layer) 14 and the n$^+$-type diamond semiconductor layer (second diamond semiconductor layer) 16. The semiconductor device 400 further includes an n-type diamond semiconductor region (first diamond semiconductor region) 18 provided on a side surface of the mesa structure and is in contact with the n$^+$-type diamond semiconductor layer (second diamond semiconductor layer) 16. The semiconductor device 400 further includes n-type diamond semiconductor regions (second diamond semiconductor regions) 26.

On a top surface of the n$^+$-type diamond semiconductor layer (second diamond semiconductor layer) 16, a base electrode (first electrode) 50 is provided. In addition, on a bottom surface of the p$^+$-type diamond semiconductor layer (third diamond semiconductor layer) 12, a collector electrode (second electrode) 52 is provided. In addition, on a top surface of a p$^+$-type diamond semiconductor layer (fourth diamond semiconductor layer) 40, an emitter electrode (third electrode) 54 is provided.

The p$^+$-type diamond semiconductor layer (fourth diamond semiconductor layer) 40 includes boron (B) as p-type impurities. In addition, a p-type impurity concentration of the p$^+$-type diamond semiconductor layer (third diamond semiconductor layer) 12 is higher than a p-type impurity concentration of the first diamond semiconductor layer 14.

Next, a method of manufacturing the semiconductor device according to this embodiment will be described. FIGS. 17 to 21 are schematic cross-sectional views illustrating the method of manufacturing the semiconductor device according to this embodiment.

First, a single crystal diamond substrate (third diamond semiconductor layer) 12 of which a surface has a plane orientation of a {100} plane is prepared. For example, a substrate 12 is of the p$^+$ type.

Figure 17:
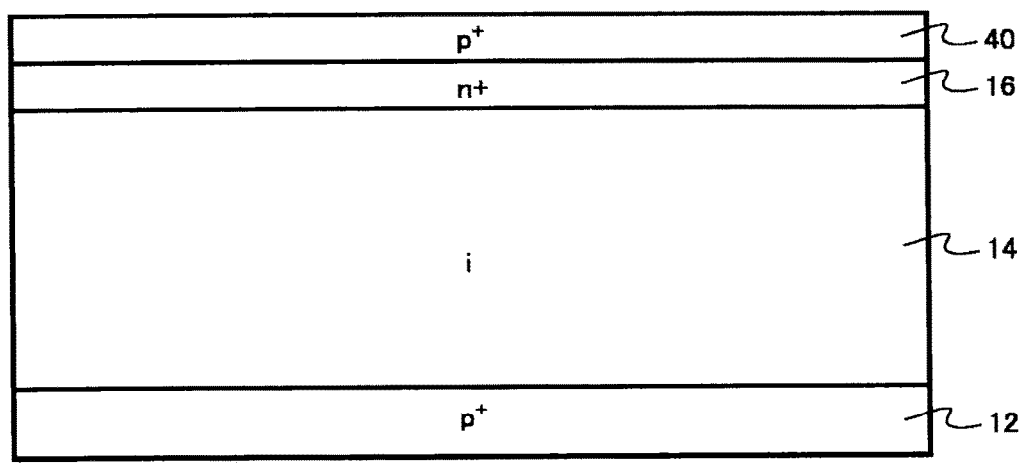
FIG. 17 is a schematic cross-sectional view illustrating a method of manufacturing the semiconductor device according to the fourth embodiment.

In addition, the i-type or the p-type diamond semiconductor layer (first diamond semiconductor layer) 14, the n$^+$-type diamond semiconductor layer (second diamond semiconductor layer) 16, and the p$^+$-type diamond semiconductor layer (fourth diamond semiconductor layer) 40 are formed on the substrate (third diamond semiconductor layer) 12 by the epitaxial growth method (refer to FIG. 17). For example, the i-type or the p-type diamond semiconductor layer (first diamond semiconductor layer) 14, the n$^+$-type diamond semiconductor layer (second diamond semiconductor layer) 16, and the p$^+$-type diamond semiconductor layer (fourth diamond semiconductor layer) 40 are formed using a microwave plasma chemical vapor deposition (CVD) method.

Figure 18:
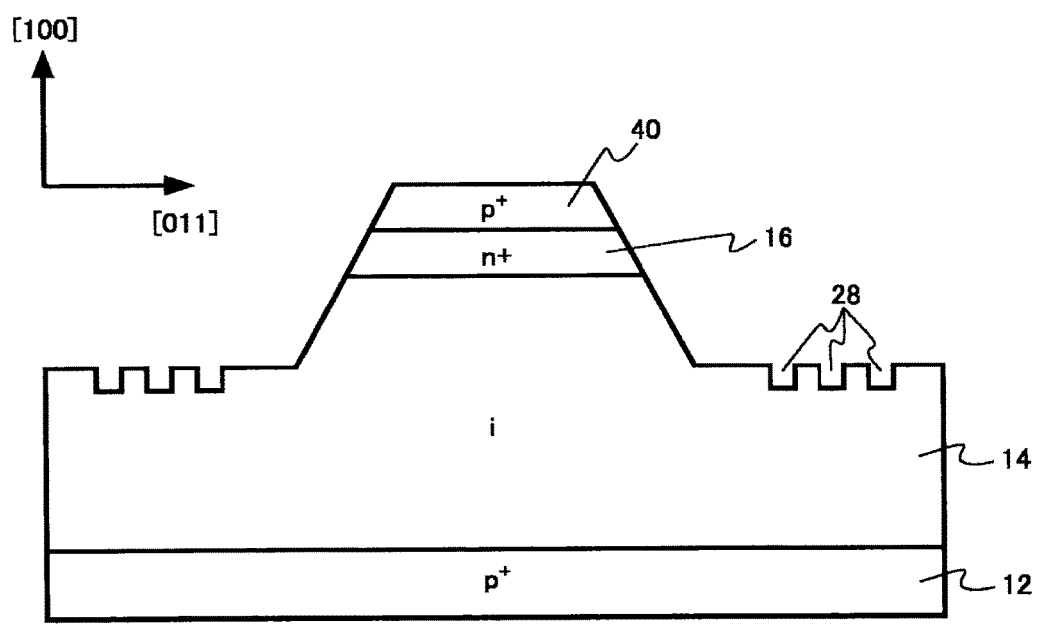
FIG. 18 is a schematic cross-sectional view illustrating the method of manufacturing the semiconductor device according to the fourth embodiment.
Figure 19:
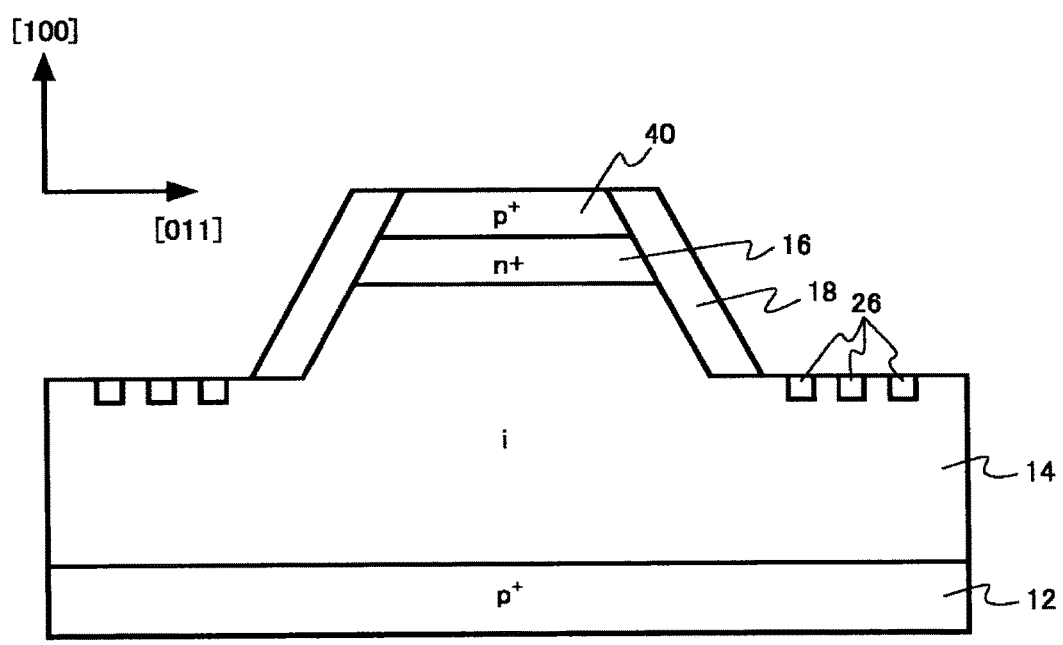
FIG. 19 is a schematic cross-sectional view illustrating the method of manufacturing the semiconductor device according to the fourth embodiment.

Then, the mesa structure is formed by etching (refer to FIG. 18). The mesa structure includes the i-type or the p-type diamond semiconductor layer 14, the n$^+$-type diamond semiconductor layer 16 and the p$^+$-type diamond semiconductor layer (fourth diamond semiconductor layer) 40. The mesa structure has a top surface with a plane orientation of ±10 degrees or less from the {100} plane and has a side surface with a plane orientation inclined by 20 to 90 degrees with respect to the direction of <011>±20 degrees from the {100} plane.

For example, the mesa structure is formed using a lithography method and a reactive ion etching (RIE) method. When the RIE is performed, taper etching is performed such that the side surface of the mesa structure has the inclination of less than 90 degrees with respect to the {100} plane. Then, grooves 28 are formed on the surface of the first diamond semiconductor layer 14 around the mesa structure, using the lithography method and the RIE method (refer to FIG. 18).

Next, the n-type diamond semiconductor region (first diamond semiconductor region) 18, which is in contact with the n$^+$-type diamond semiconductor layer (second diamond semiconductor layer) 16 and has the n-type impurity concentration lower than the n-type impurity concentration of the n$^+$-type diamond semiconductor layer 16, is formed on the side surface of the mesa structure by the epitaxial growth method. At the same time, the n-type diamond semiconductor regions (second diamond semiconductor regions) 26 are formed in the grooves 28 (refer to FIG. 19). For example, the n-type diamond semiconductor regions (second diamond semiconductor regions) 26 are formed using the microwave plasma chemical vapor deposition (CVD) method.

Figure 20:
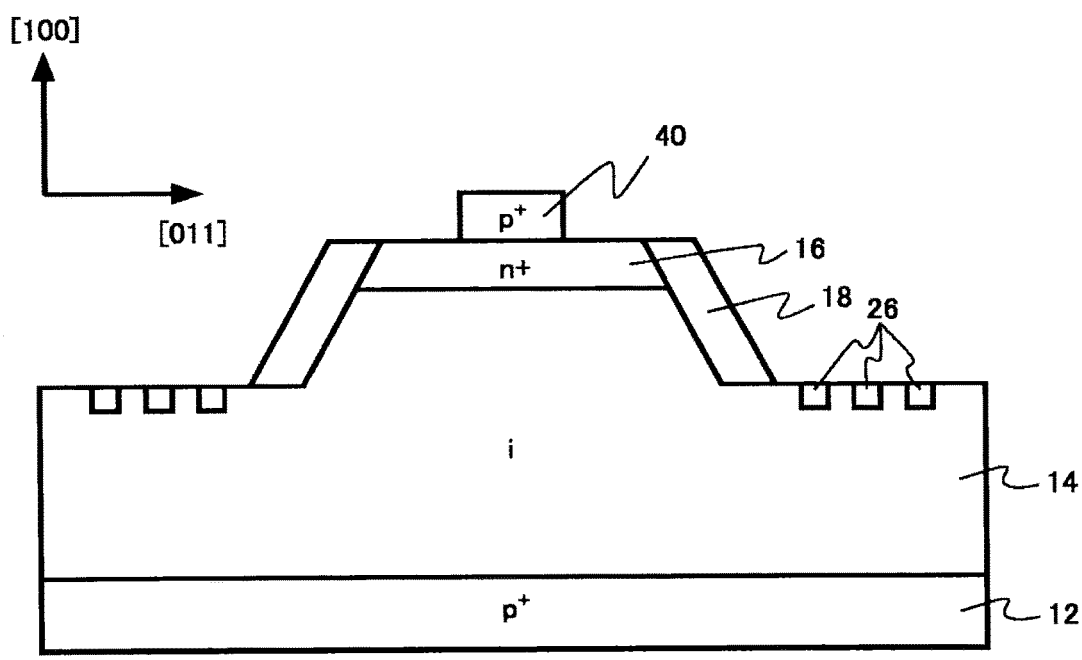
FIG. 20 is a schematic cross-sectional view illustrating the method of manufacturing the semiconductor device according to the fourth embodiment.

Then, the p$^+$-type diamond semiconductor layer (third diamond semiconductor layer) 40 is patterned using a lithography method and a reactive ion etching (RIE) method (refer to FIG. 20).

Figure 21:
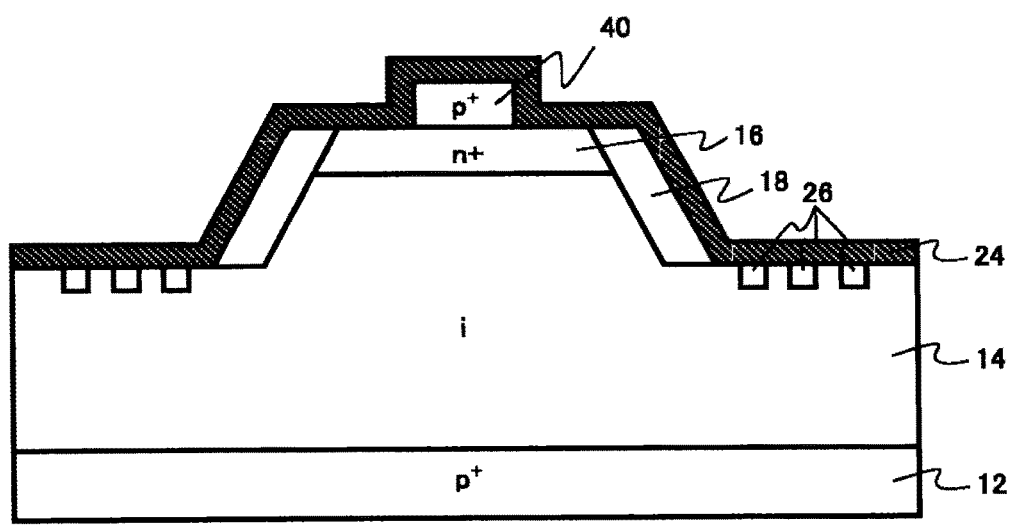
FIG. 21 is a schematic cross-sectional view illustrating the method of manufacturing the semiconductor device according to the fourth embodiment.

Next, the protection insulating film 24 is formed on the i-type or the p-type diamond semiconductor layer (first diamond semiconductor layer) 14, the n$^+$-type diamond semiconductor layer (second diamond semiconductor layer) 16, and the p$^+$-type diamond semiconductor layer (fourth diamond semiconductor layer) 40 (refer to FIG. 21). The protection insulating film 24 is, for example, a silicon nitride film formed using the CVD method.

Then, a part of the protection insulating film 24 on the n$^+$-type diamond semiconductor layer (second diamond semiconductor layer) 16 of the top surface of the mesa structure is removed using the lithography method and the RIE method. In addition, a base electrode (first electrode) 50 is formed by depositing a metal film. For example, when the metal film is deposited, titanium (Ti)/platinum (Pt)/gold (Au) is deposited by electron beam evaporation. Then, for example, heat treatment is performed.

In addition, a part of the protection insulating film 24 on the p$^+$-type diamond semiconductor layer (fourth diamond semiconductor layer) 40 of the top surface of the mesa structure is removed using the lithography method and the RIE method. In addition, an emitter electrode (third electrode) 54 is formed by depositing a metal film. For example, when the metal film is deposited, titanium (Ti)/platinum (Pt)/gold (Au) is deposited by electron beam evaporation. Then, for example, heat treatment is performed.

In addition, a collector electrode (second electrode) 52 is formed on the back surface of the substrate (third diamond semiconductor layer) 12 by depositing a metal film. For example, when the metal film is deposited, titanium (Ti)/platinum (Pt)/gold (Au) is deposited by the electron beam evaporation. Then, for example, heat treatment is performed.

By the method of manufacturing the semiconductor device described above, the semiconductor device 400 illustrated in FIG. 16 is formed.

As described above, according to this embodiment, a semiconductor device and a method of manufacturing the same that can realize a high dielectric breakdown voltage can be provided.

EXAMPLES

Hereinafter, examples will be described.

First Example

The PIN diode of the structure according to the second embodiment was manufactured.

First, the undoped diamond semiconductor layer (first diamond semiconductor layer) 14 and the n$^+$-type diamond semiconductor layer (second diamond semiconductor layer) 16 were formed on the p$^+$-type single crystal diamond substrate (third diamond semiconductor layer) 12 of which the surface has the plane orientation of the {100} plane, using the microwave plasma CVD method.

As an analysis result by secondary ion mass spectroscopy (SIMS), the boron concentration of the p$^+$-type diamond semiconductor layer 12 was $5 \times 10^{20}$ atoms/cm$^3$. The phosphorous and boron concentrations of the undoped diamond semiconductor layer (first diamond semiconductor layer) 14 were a detection limit or less ($1 \times 10^{15}$ atoms/cm$^3$ or less). The phosphorous concentration of the n$^+$-type diamond semiconductor layer (second diamond semiconductor layer) 16 was $1 \times 10^{20}$ atoms/cm$^3$.

In addition, the mesa structure was formed using the lithography method and the RIE method. The mesa structure was formed by the taper etching, such that the side surface was at 54.5 degrees with respect to a direction of <011> from the {100} plane.

Next, the n-type diamond semiconductor region (first diamond semiconductor region) 18 which is in contact with the n$^+$-type diamond semiconductor layer (second diamond semiconductor layer) 16, and the n-type diamond semiconductor region (second diamond semiconductor region) 26 were formed on the side surface of the mesa structure by the epitaxial growth method. The n-type diamond semiconductor region (first diamond semiconductor region) 18 and the n-type diamond semiconductor region (second diamond semiconductor region) 26 were formed using the microwave plasma chemical vapor deposition (CVD) method. The phosphorous concentrations of the n-type diamond semiconductor region (first diamond semiconductor region) 18 and the n-type diamond semiconductor region (second diamond semiconductor region) 26 were $2 \times 10^{17}$ atoms/cm$^3$.

The n-type diamond semiconductor region (first diamond semiconductor region) 18 and the n-type diamond semiconductor region (second diamond semiconductor region) 26 were grown in a <111> direction by adjusting an α parameter (ratio of methane and hydrogen) when a film was formed using the CVD method.

Next, the silicon nitride film formed using the CVD method was formed as the protection insulating film 24 on the i-type or the p-type diamond semiconductor layer (first diamond semiconductor layer) 14 and the n$^+$-type diamond semiconductor layer (second diamond semiconductor layer) 16.

In addition, titanium (Ti)/platinum (Pt)/gold (Au) was deposited on the n$^+$-type diamond semiconductor layer (second diamond semiconductor layer) 16 by electron beam evaporation. Then, the resultant was annealed for 10 minutes at 600° C. Next, the cathode electrode (first electrode: negative electrode) 20 was formed.

In addition, titanium (Ti)/platinum (Pt)/gold (Au) was deposited on the back surface side of the substrate (third diamond semiconductor layer) 12 by the electron beam evaporation. Then, the resultant was annealed for 10 minutes at 600° C. Thereby, the anode electrode (second electrode) 22 was formed.

As a measurement result of an I-V characteristic of the manufactured PIN diode, a rectification ratio at ±10 V was 10 digits or more and a forward current density at 10 V was 1000 A/cm$^2$. In addition, the breakdown did not occur, even though a voltage was applied to 10 kV in a backward direction.

Second Example

The PIN diode of the structure according to the third embodiment was manufactured.

Different from the first example, the n-type diamond semiconductor region (first diamond semiconductor region) 18 was also grown on the surface of the i-type or the p-type first diamond semiconductor layer 14 around the mesa structure, by adjusting an α parameter, when the n-type diamond semiconductor region (first diamond semiconductor region) 18 and the n-type diamond semiconductor region (second diamond semiconductor region) 26 were formed.

The other configuration was the same as that of the first example.

As a measurement result of an I-V characteristic of the manufactured PIN diode, a rectification ratio at ±10 V was 10 digits or more and a forward current density at 10 V was 1000 A/cm$^2$. In addition, the breakdown did not occur, even though a voltage was applied to 10 kV in a backward direction.

Third Example

The bipolar transistor of the structure according to the fourth embodiment was manufactured.

First, the undoped diamond semiconductor layer (first diamond semiconductor layer) 14, the n$^+$-type diamond semiconductor layer (second diamond semiconductor layer) 16, and the p$^+$-type diamond semiconductor layer (fourth diamond semiconductor layer) 40 were formed on the p$^+$-type single crystal diamond substrate (third diamond semiconductor layer) 12 of which the surface had the plane orientation of the {100}plane, using the microwave plasma CVD method.

As an analysis result by secondary ion mass spectroscopy (SIMS), the boron concentration of the p$^+$-type diamond semiconductor layer 12 was 5×10$^{20}$ atoms/cm$^3$. The phosphorous and boron concentrations of the undoped diamond semiconductor layer (first diamond semiconductor layer) 14 were a detection limit or less (1×10$^{15}$ atoms/cm$^3$ or less). The phosphorous concentration of the n$^+$-type diamond semiconductor layer (second diamond semiconductor layer) 16 was 1×10$^{20}$ atoms/cm$^3$. The boron concentration of the p$^+$-type diamond semiconductor layer (fourth diamond semiconductor layer) 40 was 5×10$^{20}$ atoms/cm$^3$.

In addition, the mesa structure was formed using the lithography method and the RIE method. The mesa structure was formed by the taper etching, such that the side surface was at 55 degrees with respect to a direction of <011> from the {100} plane.

Next, the n-type diamond semiconductor region (first diamond semiconductor region) 18 which is in contact with the n$^+$-type diamond semiconductor layer (second diamond semiconductor layer) 16 and the n-type diamond semiconductor region (second diamond semiconductor region) 26 were formed on the side surface of the mesa structure by the epitaxial growth method. The n-type diamond semiconductor region (first diamond semiconductor region) 18 and the n-type diamond semiconductor region (second diamond semiconductor region) 26 were formed using the microwave plasma chemical vapor deposition (CVD) method. The phosphorous concentrations of the n-type diamond semiconductor region (first diamond semiconductor region) 18 and the n-type diamond semiconductor region (second diamond semiconductor region) 26 were 2×10$^{17}$ atoms/cm$^3$.

At this time, the n-type diamond semiconductor region (first diamond semiconductor region) 18 was grown in a <111> direction by adjusting an α parameter (ratio of methane and hydrogen) when a film was formed using the CVD method.

Next, the silicon nitride film formed using the CVD method was formed as the protection insulating film 24 on the i-type or the p-type diamond semiconductor layer (first diamond semiconductor layer) 14, the n$^+$-type diamond semiconductor layer (second diamond semiconductor layer) 16, and the p$^+$-type diamond semiconductor layer (fourth diamond semiconductor layer) 40.

In addition, titanium (Ti)/platinum (Pt)/gold (Au) was deposited on the n$^+$-type diamond semiconductor layer (second diamond semiconductor layer) 16 by electron beam evaporation. Then, the resultant was annealed for 10 minutes at 600° C. Thereby, the base electrode (first electrode) 50 was formed.

In addition, titanium (Ti)/platinum (Pt)/gold (Au) was deposited on the p$^+$-type diamond semiconductor layer (fourth diamond semiconductor layer) 40 by the electron beam evaporation. Then, the resultant was annealed for 10 minutes at 600° C. Thereby, the emitter electrode (third electrode) 54 was formed.

In addition, titanium (Ti)/platinum (Pt)/gold (Au) was deposited on the back surface side of the substrate (third diamond semiconductor layer) 12 by the electron beam evaporation. Then, the resultant was annealed for 10 minutes at 600° C. Thereby, the collector electrode (second electrode) 52 was formed.

A transistor operation of the manufactured bipolar transistor was confirmed. In addition, the breakdown did not occur, even though a voltage was applied to 10 kV in a backward direction.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an i-type or a p-type first diamond semiconductor layer;
   an n-type second diamond semiconductor layer provided on the first diamond semiconductor layer;
   a mesa structure including
   the first diamond semiconductor layer,
   the second diamond semiconductor layer,
   a top surface with a plane orientation of ±10 degrees or less from a {100} plane, and
   a side surface inclined by 20 to 90 degrees with respect to a direction of <011>±20 degrees from the {100} plane; and
   an n-type first diamond semiconductor region provided on the side surface, the first diamond semiconductor region being in contact with the second diamond semiconductor layer and having an n-type impurity concentration lower than an n-type impurity concentration of the second diamond semiconductor layer;
   a p-type third diamond semiconductor layer provided on the first diamond semiconductor layer opposite to the second diamond semiconductor layer, the third diamond semiconductor layer having a p-type impurity concentration higher than a p-type impurity concentration of the first diamond semiconductor layer;
   a p-type fourth diamond semiconductor layer provided on the second diamond semiconductor layer;
   a first electrode electrically connected to the second diamond semiconductor layer, the first electrode provided directly on the second diamond semiconductor layer;
   a second electrode electrically connected to the third diamond semiconductor layer, the second electrode provided directly on the third diamond semiconductor layer; and a third electrode electrically connected to the fourth diamond semiconductor layer, the third electrode provided directly on the fourth diamond semiconductor layer.

2. The device according to claim 1, further comprising:
a plurality of n-type second diamond semiconductor regions provided on a surface of the first diamond semiconductor layer around the mesa structure, the second diamond semiconductor regions having an n-type impurity concentration lower than the n-type impurity concentration of the second diamond semiconductor layer, the second diamond semiconductor regions being aligned in a [011], [0-11], [0-1-1] or [01-1] direction, the second diamond semiconductor regions extending linearly, one of the second semiconductor regions being separately disposed from one of the other second semiconductor regions.

3. The device according to claim 2,
wherein the first diamond semiconductor region and the second diamond semiconductor region are in contact with each other.

4. The device according to claim 2, therein the second diamond semiconductor regions are provided at the same width and the same interval.

5. The device according to claim 2, wherein the first diamond semiconductor region and the second diamond semiconductor region are not in contact with each other.

6. The device according to claim 1,
wherein n-type impurities of the first diamond semiconductor region are phosphorous (P) and a phosphorus concentration is between $1\times10^{15}$ atoms/cm$^3$ and $5\times10^{18}$ atoms/cm$^3$ inclusive.

7. The device according to claim 1,
wherein the side surface has a plane orientation inclined by 45 to 65 degrees with respect to the direction of <011>±20 degrees from the {100} plane.

8. The device according to claim 1,
wherein the first diamond semiconductor region is provided on a corner portion of the top surface and the side surface.

9. A semiconductor device comprising:
an i-type or a p-type first diamond semiconductor layer;
an n-type second diamond semiconductor layer provided on the first diamond semiconductor layer;
a mesa structure including
  the first diamond semiconductor layer,
  the second diamond semiconductor layer,
  a top surface with a plane orientation of ±10 degrees or less from a {100} plane, and
  a side surface inclined by 20 to 90 degrees with respect to a direction of <011>±20 degrees from the {100} plane;
an n-type first diamond semiconductor region provided on the side surface, the first diamond semiconductor region being in contact with the second diamond semiconductor layer and having an n-type impurity concentration lower than an n-type impurity concentration of the second diamond semiconductor layer;
a plurality of n-type second diamond semiconductor regions provided on a surface of the first diamond semiconductor layer around the mesa structure, the plurality of n-type second diamond semiconductor regions having an n-type impurity concentration lower than the n-type impurity concentration of the second diamond semiconductor layer, the second diamond semiconductor regions provided at the same width and the same interval;
a p-type third diamond semiconductor layer provided on the first diamond semiconductor layer opposite to the second diamond semiconductor layer, the third diamond semiconductor layer having a p-type impurity concentration higher than a p-type impurity concentration of the first diamond semiconductor layer;
a first electrode electrically connected to the second diamond semiconductor layer, the first electrode provided directly on the second diamond semiconductor layer; and
a second electrode electrically connected to the third diamond semiconductor layer, the second electrode provided directly on the third diamond semiconductor layer.

10. The device according to claim 9, further comprising:
a plurality of n-type second diamond semiconductor regions provided on a surface of the first diamond semiconductor layer around the mesa structure, the second diamond semiconductor regions having an n-type impurity concentration lower than the n-type impurity concentration of the second diamond semiconductor layer, the second diamond semiconductor regions being aligned in a [011], [0-11] [0-1-1] or [01-1] direction, the second diamond semiconductor regions extending linearly, one of the second semiconductor regions being separately disposed from one of the other second semiconductor regions.

11. A semiconductor device comprising:
an i-type or a p-type first diamond semiconductor layer;
an n-type second diamond semiconductor layer provided on the first diamond semiconductor layer;
a mesa structure including
  the first diamond semiconductor layer,
  the second diamond semiconductor layer,
  a top surface with a plane orientation of ±10 degrees or less from a {100} plane, and
  a side surface inclined by 20 to 90 degrees with respect to a direction of <011>±20 degrees from the {100} plane;
an n-type first diamond semiconductor region provided on the side surface, the first diamond semiconductor region being in contact with the second diamond semiconductor layer and having an n-type impurity concentration lower than an n-type impurity concentration of the second diamond semiconductor layer;
a plurality of n-type second diamond semiconductor regions provided on a surface of the first diamond semiconductor layer around the mesa structure, the plurality of n-type second diamond semiconductor regions having an n-type impurity concentration lower than the n-type impurity concentration of the second diamond semiconductor layer, the first diamond semiconductor region and the second diamond semiconductor region not being in contact with each other;
a p-type third diamond semiconductor layer provided on the first diamond semiconductor layer opposite to the second diamond semiconductor layer, the third diamond semiconductor layer having a p-type impurity concentration higher than a p-type impurity concentration of the first diamond semiconductor layer;
a first electrode electrically connected to the second diamond semiconductor layer, the first electrode provided directly on the second diamond semiconductor layer; and a second electrode electrically connected to the third diamond semiconductor layer, the second electrode provided directly on the third diamond semiconductor layer.

12. The device according to claim 11, further comprising:
a plurality of n-type second diamond semiconductor regions provided on a surface of the first diamond semiconductor layer around the mesa structure, the second diamond semiconductor regions having an n-type impurity concentration lower than the n-type impurity concentration of the second diamond semiconductor layer, the second diamond semiconductor regions being aligned in a [011], [0-11], [0-1-1] or [01-1] direction, the second diamond semiconductor regions extending linearly, one of the second semiconductor regions being separately disposed from one of the other second semiconductor regions.

* * * * *